United States Patent
Sasaki

(10) Patent No.: US 10,580,974 B2
(45) Date of Patent: Mar. 3, 2020

(54) MAGNETORESISTANCE EFFECT ELEMENT

(71) Applicant: TDK CORPORATION, Tokyo (JP)

(72) Inventor: Tomoyuki Sasaki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

(21) Appl. No.: 15/371,987

(22) Filed: Dec. 7, 2016

(65) Prior Publication Data

US 2017/0170392 A1    Jun. 15, 2017

(30) Foreign Application Priority Data

Dec. 11, 2015 (JP) .................................. 2015/242355

(51) Int. Cl.
*H01L 43/10* (2006.01)
*G01R 33/09* (2006.01)
(Continued)

(52) U.S. Cl.
CPC ............ *H01L 43/10* (2013.01); *G01R 33/098* (2013.01); *G11B 5/3906* (2013.01);
(Continued)

(58) Field of Classification Search
CPC ..... G11C 11/16; G11C 11/161; G11B 5/3909; G01R 33/098; H01L 43/10
See application file for complete search history.

(56) References Cited

U.S. PATENT DOCUMENTS

| 4,624,901 A | * | 11/1986 | Glass | ..................... B82Y 25/00 117/63 |
| 6,219,274 B1 | * | 4/2001 | Shimazawa | ............ B82Y 10/00 257/E43.004 |

(Continued)

FOREIGN PATENT DOCUMENTS

| JP | 2012-204348 A | 10/2012 |
| JP | 2013-175615 A | 9/2013 |
| JP | 5586028 B2 | 9/2014 |

OTHER PUBLICATIONS

Sukegawa et al, Tunnel magnetoresistance with improved bias voltage dependence in lattice-matched Fe/spinel MgAl2O4/Fe (001) junctions, Applied Physics Letter, 96, 212505, 2010.*

(Continued)

*Primary Examiner* — Cuong Q Nguyen
*Assistant Examiner* — Shih Tsun A Chou
(74) *Attorney, Agent, or Firm* — Oliff PLC

(57) ABSTRACT

A magnetoresistance effect element is provided in which a MR ratio is not likely to decrease even at a high bias voltage. A magnetoresistance effect element according to an aspect of the present invention includes: a first ferromagnetic metal layer; a second ferromagnetic metal layer; a tunnel barrier layer that is provided between the first ferromagnetic metal layer and the second ferromagnetic metal layer, in which the tunnel barrier layer is formed of a non-magnetic oxide having a cubic crystal structure represented by a compositional formula $A_{1-x}A'_xO$ (A represents a divalent cation, and A' represents a trivalent cation), a space group of the crystal structure is any one selected from the group consisting of Pm3m, I-43m, and Pm-3m, and the number of A ions is more than the number of A' ions in a primitive lattice of the crystal structure.

13 Claims, 8 Drawing Sheets

(51) Int. Cl.
G11B 5/39 (2006.01)
G11C 11/16 (2006.01)
H01F 10/12 (2006.01)
H01F 10/32 (2006.01)

(52) U.S. Cl.
CPC ............ *G11C 11/161* (2013.01); *H01F 10/12* (2013.01); *H01F 10/324* (2013.01)

(56) References Cited

U.S. PATENT DOCUMENTS

| | | | | | |
|---|---|---|---|---|---|
| 6,335,081 | B1* | 1/2002 | Araki | ...................... | B82Y 10/00 324/252 |
| 6,483,675 | B1* | 11/2002 | Araki | .................. | G11B 5/3903 257/E43.004 |
| 6,574,079 | B2* | 6/2003 | Sun | ........................ | B82Y 10/00 257/E43.004 |
| 8,564,911 | B2* | 10/2013 | Koike | ................... | B82Y 10/00 360/324.2 |
| 8,872,291 | B2* | 10/2014 | Sukegawa | ............... | H01L 43/08 257/295 |
| 9,065,039 | B2* | 6/2015 | Park | ....................... | G11C 11/16 |
| 10,109,788 | B2* | 10/2018 | Sasaki | ..................... | H01L 43/08 |
| 10,199,570 | B2* | 2/2019 | Sasaki | ..................... | G01R 33/09 |
| 10,224,067 | B2* | 3/2019 | Sasaki | ...................... | G11B 5/39 |
| 2008/0138660 | A1 | 6/2008 | Parkin | | |
| 2010/0080894 | A1* | 4/2010 | Tsunekawa | ............ | B82Y 25/00 427/131 |
| 2011/0068786 | A1* | 3/2011 | Ohta | ..................... | B82Y 25/00 324/252 |
| 2011/0227018 | A1* | 9/2011 | Kuribayashi | .......... | B82Y 10/00 257/2 |
| 2012/0038355 | A1* | 2/2012 | Sasaki | ................ | G01R 33/1284 324/244 |
| 2012/0091548 | A1* | 4/2012 | Sukegawa | ............. | B82Y 10/00 257/421 |
| 2012/0241883 | A1 | 9/2012 | Sasaki et al. | | |
| 2013/0075839 | A1* | 3/2013 | Chen | ...................... | H01L 43/08 257/421 |
| 2013/0221461 | A1* | 8/2013 | Sukegawa | ............... | H01L 43/08 257/421 |
| 2015/0001601 | A1* | 1/2015 | Koike | .................... | H01L 43/02 257/295 |
| 2015/0179925 | A1* | 6/2015 | Tahmasebi | ............ | H01L 27/222 257/421 |
| 2016/0276007 | A1* | 9/2016 | Sugiyama | ............. | G11C 11/161 |
| 2017/0110651 | A1* | 4/2017 | Park | ....................... | H01L 43/02 |
| 2017/0117455 | A1* | 4/2017 | Kim | ....................... | H01L 43/02 |
| 2017/0125666 | A1* | 5/2017 | Han | ........................ | H01L 43/02 |

OTHER PUBLICATIONS

Sukegawa et al, MgGa2O4 spinel barrier for magnetic tunnel junctions: Coherent tunneling and low barrier height, Applied Physics Letter, 110, 122404, 2017.*

Zhang et al., Spinel oxides: spin-filter barrier for a class of magnetic tunnel junctions, Applied Physics Letter, 100, 222401, 2012.*

Hestens et al. The Crystallographic Space Groups in Geometric Algebra, Journal of Mathematical Physics, Jan. 2007.*

Bondareva et al., A Refined Crystallographic Structure of the Cubic Framework of Zinc Borate Zn4O[B6O12], Reports of The USSR Academy of Sciences, (1978), 241(4), 815-17.*

Smith P., Structure of zinc metaborate, Zn4O(BO2)6, Anales Real Soc. Espan., Fis. Quim. Madrid, Ser A (1961), 57(No. 11-12), 263-8.*

Fang et al., Wavefunction character of the F-center in table salt, J. Phys.: Condens. Matter 20 (2008) p. 075219.*

Wikipedia, Cubic crystal system, version 22 Sep. 2015 (https://en.wikipedia.org/w/index.php?title=Cubic_crystal_system&oldid=682320548 ) (Year: 2015).*

Sukegawa et al., Tunnel magnetoresistance with improved bias voltage dependence in lattice-matched Fe/spinel MgAl2O4 /Fe (001) junctions, Applied Physics Letters 96, 212505 (Year: 2010).*

Naval Research Laboratory, Structures in a Cubic Space Group (#195-#230), archived Sep. 10, 2012 (https://web.archive.org/web/20120910224300/http://cst-www.nrl.navy.mil/lattice/spcgrp/cubic.html) (Year: 2012).*

* cited by examiner

MAGNETORESISTANCE EFFECT ELEMENT

BACKGROUND OF THE INVENTION

Field of the Invention

The present invention relates to a magnetoresistance effect element.

Description of Related Art

A giant magnetoresistance (GMR) element which is formed of a multilayer film including ferromagnetic layers and non-magnetic layers, and a tunnel magnetoresistance effect (TMR) element in which an insulating layer (a tunnel barrier layer or a barrier layer) is used as a non-magnetic layer are known. In general, a TMR element has a higher element resistance than a GMR element but has a higher magnetoresistance (MR) ratio than a GMR element. Therefore, a TMR element has attracted attention as an element for a magnetic sensor, a high-frequency component, a magnetic read head, or a magnetoresistive random access memory (MRAM).

A TMR element can be classified into two types depending on the mechanism of tunnel transport of electrons. In one type of a TMR element, only the penetrating effect (tunneling effect) of wave functions between ferromagnetic layers is used. In the other type of a TMR element, coherent tunneling (only electrons having a specific wave function symmetry tunnel), which is tunneling using a specific orbital transport of non-magnetic insulating layers, is predominant. It is known that, in a TMR element where coherent tunneling is predominant, a MR ratio higher than that of a TMR element in which only the tunneling effect is used is obtained.

In order to cause the coherent tunneling effect to occur, it is necessary that two ferromagnetic metal layers and a tunnel barrier layer be crystalline and that interfaces between the two ferromagnetic metal layers and the tunnel barrier layer be crystallographically continuous.

As a tunnel barrier layer in which the coherent tunneling effect can be obtained, a MgO layer is known. In addition, United States Patent Applications, Publication No. 2008/0138660 and Japanese Unexamined Patent Application, First Publication No. 2012-204348 describe that the coherent tunneling effect can be obtained in (MgZn)O in which Mg ions in MgO are partially substituted with Zn ions.

In addition, Japanese Patent No. 5586028 reports $MgAl_2O_4$ having a spinel structure as an alternative material to MgO. Japanese Unexamined Patent Application, First Publication No. 2013-175615 describes that $MgAl_2O_4$ having a disordered spinel structure is used as a tunnel barrier layer.

SUMMARY OF THE INVENTION

However, a tunnel barrier layer which is formed of the material described in United States Patent Applications, Publication No. 2008/0138660 and Japanese Unexamined Patent Application, First Publication No. 2012-204348 has a problem in that, in a case where a bias voltage applied to a TMR element increases, the MR ratio decreases significantly.

In future devices such as a magnetic sensor or an MRAM, a demand for a TMR element in which a sufficient MR ratio can be obtained even at a high bias voltage has increased, and the magnetoresistance effect element described in United States Patent Applications, Publication No. 2008/0138660 and Japanese Unexamined Patent Application, First Publication No. 2012-204348 cannot satisfy this demand.

For example, in a magnetic sensor, a magnetoresistance effect element in which a fine magnetic field such as geomagnetism or biomagnetism can be observed is required. In order to observe such a fine magnetic field, it is necessary to amplify an electrical signal which is obtained as a change in resistance on a circuit. In order to realize high-sensitivity observation without performing the amplification, it is necessary to increase an output voltage or an output current, and a TMR element in which a sufficient MR ratio can be obtained even at a high bias voltage is required.

In addition, for example, in a MRAM, high-voltage driving is necessary in a write operation. The write operation is performed by changing a magnetization direction of a ferromagnetic layer in a magnetoresistance effect element. The magnetization direction of a ferromagnetic layer changes by a spin-polarized current acting on spins in the ferromagnetic layer. That is, in order to perform the write operation, it is necessary that a current density which is high enough to change a direction of the spin in the ferromagnetic layer be applied to a magnetoresistance effect element, and a TMR element in which a sufficient MR ratio can be obtained even at a high bias voltage is required.

In addition, Japanese Patent No. 5586028 and Japanese Unexamined Patent Applications, First Publication No. 2013-175615 describe that a high MR ratio can be obtained even at a high bias voltage by reducing lattice mismatch in a tunnel barrier layer having a spinel structure represented by $MgAl_2O_4$. However, a TMR element in which a high MR ratio can be obtained even at a high bias voltage using a tunnel barrier layer having a crystal structure similar to a NaCl structure which is represented by MgO is not known. In a case where the tunnel barrier layer having a crystal structure similar to a NaCl structure is used in combination with a ferromagnetic material having a BCC structure, a higher MR ratio can be obtained. The reason for this is that coherent tunneling occurs due to band symmetry. In a case where the crystal symmetry decreases, an electron band is formed, and the number of electrons for causing coherent tunneling to occur is reduced, which leads to a decrease in MR ratio. It is known that, in the case of $MgAl_2O_4$ having a spinel structure, the MR ratio decreases more than the tunnel barrier layer having a crystal structure similar to a NaCl structure, but the width of the decrease is small. However, in a device in which a high bias voltage is not required, it is preferable that the MR ratio be as high as possible. In addition, in the case of $MgAl_2O_4$ having a spinel structure, the lattice constant can be adjusted to an arbitrary value corresponding to a ferromagnetic material. Therefore, it is thought that the dependence of an applied voltage on a bias voltage is high.

The present invention has been made in consideration of the above-described circumstances, and an object thereof is to provide a magnetoresistance effect element in which a high MR ratio can be maintained even at a high bias voltage.

The present inventors thought that the reason why the MR ratio decreases significantly along with an increase in bias voltage is distortion of a crystal structure caused by lattice mismatch between two ferromagnetic metal layers and a tunnel barrier layer, and found that, by causing the tunnel barrier layer to have a predetermined composition and a predetermined structure, a magnetoresistance effect element in which a high MR ratio can be maintained even at a high bias voltage can be provided, thereby completing the present invention.

That is, in order to solve the above-described problems, the present invention provides the following means.

(1) A magnetoresistance effect element according to an aspect of the present invention includes: a first ferromagnetic metal layer; a second ferromagnetic metal layer; a tunnel barrier layer that is provided between the first ferromagnetic metal layer and the second ferromagnetic metal layer, in which the tunnel barrier layer is formed of a non-magnetic oxide having a cubic crystal structure represented by a compositional formula $A_{1-x}A'_xO$ (A represents a divalent cation, A' represents a trivalent cation, and x satisfies 0<x<0.5), a space group of the crystal structure is any one selected from the group consisting of Pm3m, I-43m, and Pm-3m, and the number of A ions is more than the number of A' ions in a primitive lattice of the crystal structure.

(2) In the magnetoresistance effect element according to (1), A in the compositional formula may represent at least one selected from the group consisting of beryllium, magnesium, and zinc.

(3) In the magnetoresistance effect element according to (1) or (2), A' in the compositional formula may represent at least one selected from the group consisting of boron, aluminum, and gallium.

(4) In the magnetoresistance effect element according to (1) or (2), A' in the compositional formula may represent boron, and x in the compositional formula may satisfy 0.05<x≤0.2.

(5) In the magnetoresistance effect element according to (1) or (2), A' in the compositional formula may represent aluminum, and x in the compositional formula may satisfy 0<x<0.5.

(6) In the magnetoresistance effect element according to (1) or (2), A' in the compositional formula may represent gallium, and x in the compositional formula may satisfy 0<x<0.5.

According to the aspect of the present invention, a magnetoresistance effect element in which a high MR ratio can be maintained even at a high bias voltage can be provided.

DETAILED DESCRIPTION OF THE INVENTION

Figure 1:
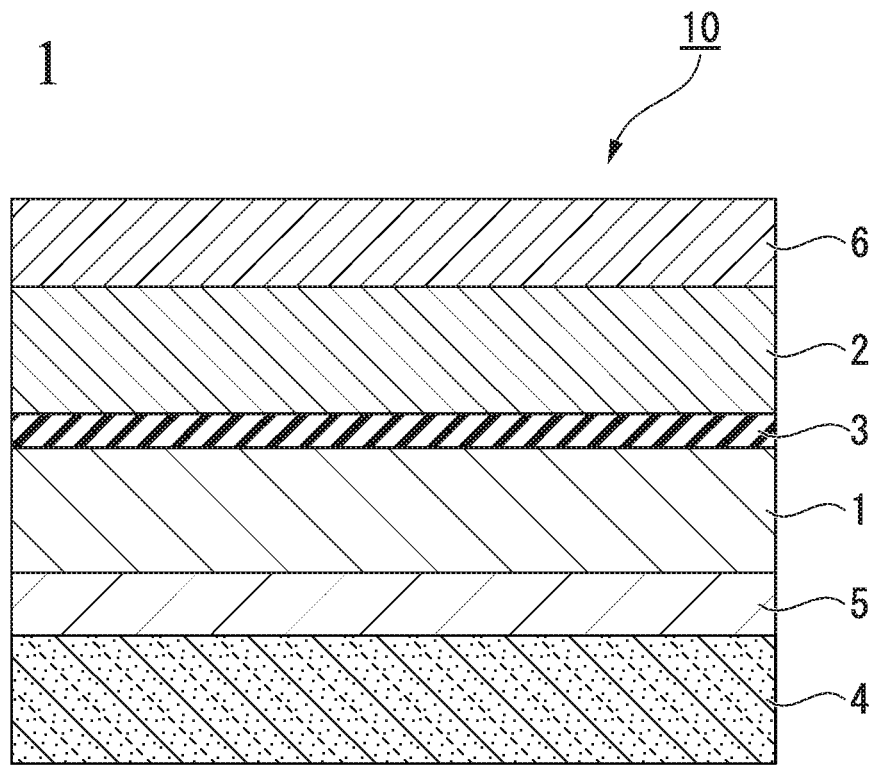
FIG. 1 is a schematic cross-sectional view showing a magnetoresistance effect element according to an embodiment of the present invention.

Hereinafter, the present invention will be described in detail while appropriately referring to the drawings. In the drawings used in the following description, in order to make the characteristics of the present invention easily understood, distinctive portions may be enlarged and shown for convenience, and a dimensional ratio between components and the like may be different from actual ones. In the following description, materials, dimensions, and the like are merely exemplary, and the present invention is not limited thereto. Within a range where the scope of the present invention does not change, materials, dimensions, and the like can be appropriately changed.

FIG. 1 is a schematic cross-sectional view showing a magnetoresistance effect element according to an embodiment of the present invention. A magnetoresistance effect element 10 according to the embodiment of the present invention includes a first ferromagnetic metal layer 1, a second ferromagnetic metal layer 2, and a tunnel barrier layer 3. In addition, as shown in FIG. 1, the first ferromagnetic metal layer 1 may be formed on an undercoat layer 5 that is provided on a substrate 4, and a cap layer 6 may be provided on a surface of the second ferromagnetic metal layer 2 opposite to a surface in contact with the tunnel barrier layer 3.

(Tunnel Barrier Layer)

The tunnel barrier layer 3 is formed of a non-magnetic insulating material. The thickness of the tunnel barrier layer 3 is generally 3 nm or less. In a case where the tunnel barrier layer 3 is interposed between metal materials, wave functions of electrons in atoms of the metal material extend over the tunnel barrier layer 3. Therefore, although an insulator is present on a circuit, a current flows. The magnetoresistance effect element 10 has a structure in which the tunnel barrier layer 3 is interposed between ferromagnetic metal materials (the first ferromagnetic metal layer 1 and the second ferromagnetic metal layer 2), and a resistance value thereof is determined by a relative angle between each of magnetization directions of the ferromagnetic metals.

A magnetoresistance effect element is classified into two types including: a type in which the typical tunneling effect is used; and a type in which the coherent tunneling effect where an orbit for tunneling is limited is predominant. In the typical tunneling effect, a magnetoresistance effect is obtained by spin polarization of ferromagnetic materials, and in the coherent tunneling, an orbit for tunneling is limited. Therefore, in a magnetoresistance effect element in which coherent tunneling is predominant, an effect higher than or equivalent to spin polarization of ferromagnetic metal materials can be expected. In order to exhibit the coherent tunneling effect, it is necessary that the ferromagnetic metal materials and the tunnel barrier layer 3 be crystallized and joined in a specific orientation.

A crystal structure of the tunnel barrier layer 3 is cubic, and a space group of the crystal structure is any one selected from the group consisting of Pm3m, I-43m, and Pm-3m.

A cubic structure having symmetry of the space group Pm3m is a NaCl structure, and a cubic structure having symmetry of the space group I-43m or Pm-3m is a structure distorted from a NaCl structure.

A NaCl structure has the same crystal structure as MgO, which is used as the tunnel barrier layer 3 in the past. Therefore, by interposing the tunnel barrier layer 3 having a NaCl structure between the first ferromagnetic metal layer 1 and the second ferromagnetic metal layer 2, the coherent tunneling effect occurs. In addition, it was verified that, in the cubic structure having symmetry of the space group I-43m or Pm-3m which is slightly distorted from a NaCl structure, the coherent tunneling effect also occurs. Whether or not tunneling is the coherent tunneling effect can be estimated from the MR ratio. It is thought that, in a TMR element in which a general ferromagnetic material such as iron is used, the upper limit of the MR ratio is about 80%. Therefore, it can be thought that, in a case where the MR ratio is higher than about 80%, the coherent tunneling effect is exhibited.

In addition, the tunnel barrier layer 3 is represented by a compositional formula $A_{1-x}A'_xO$ (A represents a divalent cation, A' represents a trivalent cation, $0<x<0.5$). The compositional formula described in this specification refers to a stoichiometric compositional formula of the tunnel barrier layer 3, and deviations of the composition are allowable within a range where the effects of the present invention are exhibited. For example, a compositional formula $A_{1-x}A'_xO_{1-\delta}$ where oxygen deficiency or the like generally occurs is included within a range of the compositional formula $A_{1-x}A'_xO$.

The tunnel barrier layer represented by the compositional formula $A_{1-x}A'_xO$ is different from MgO, which is widely used as a tunnel barrier layer, in that some of divalent ions (A ions: for example, $Mg^{2+}$) are substituted with trivalent ions (A' ions).

In general, it is known that, in a case where ferromagnetic metal layers are formed of Fe and a tunnel barrier layer is formed of MgO, each of lattice constants thereof have a variation of about 3%. In a case where a tunnel barrier layer is formed of MgO, a variation in lattice constant between ferromagnetic metal layers and the tunnel barrier layer caused by oxygen deficiency can be reduced to some extent. However, the variation in lattice constant caused by oxygen deficiency is small, and lattice mismatch between the ferromagnetic metal layers and the tunnel barrier layer cannot be sufficiently reduced.

On the other hand, in the tunnel barrier layer 3 of the magnetoresistance effect element 10 according to one embodiment of the present invention, some of divalent ions (A ions: for example, $Mg^{2+}$) are substituted with trivalent ions (A' ions). In a case where predetermined ions are substituted with ions having a different ionic radius from that of the predetermined ions, the lattice constant of crystals constituting the tunnel barrier layer 3 changes greatly. As a result, lattice mismatch described below between the first and second ferromagnetic metal layer 1 and 2 and the tunnel barrier layer 3 can be reduced. In addition, by changing the substitution amount and ion species to be substituted, the lattice constant of crystals constituting the tunnel barrier layer 3 can be freely controlled, and as a result, lattice constant mismatch between the first ferromagnetic metal layers (the first and second ferromagnetic metal layer 1 and 2) and the tunnel barrier layer 3 can be reduced.

In the magnetoresistance effect element 10 in which lattice constant mismatch between the ferromagnetic metal layers and the tunnel barrier layer is reduced, a sufficient MR ratio can be obtained even at a high bias voltage. The reason for this is that, by reducing lattice constant mismatch between the ferromagnetic metal layers and the tunnel barrier layer, the crystalline continuity at interfaces therebetween is increased, and the amount of spin scattering is reduced.

In a case where there is lattice constant mismatch between the ferromagnetic metal layers and the tunnel barrier layer, spins are scattered at interfaces therebetween. Since the amount of spins propagating along the inside of the magnetoresistance effect element 10 during the application of a high bias voltage increases, the effect thereof is significant.

As described above, in the magnetoresistance effect element 10 according to one embodiment of the present invention, lattice constant mismatch between the ferromagnetic metal layers and the tunnel barrier layer is reduced, spin scattering at interfaces therebetween is reduced, and thus a sufficient MR ratio can be obtained even at a high bias voltage. As a result, the magnetoresistance effect element 10 according to one embodiment of the present invention can be used in a device such as a high-sensitivity magnetic sensor, logic-in-memory, or MRAM to which a high bias voltage is applied.

The amount of a decrease in MR ratio during the application of a bias voltage can be represented by an index $V_{half}$. $V_{half}$ represents, in a case where a low bias voltage is used as a reference, a bias voltage at which the MR ratio is reduced to half of that measured during the application of the low bias voltage. The low bias voltage is, for example, 1 mV. In addition, since the optimum low bias voltage varies depending on the resistance value of the magnetoresistance effect element, the low bias voltage only has to be a voltage which is 1/10 or lower of $V_{half}$.

In addition, the substitution of some of divalent ions (A ions: for example, $Mg^{2+}$) with trivalent ions (A' ions) also causes an effect of reducing a resistance-area (RA) product of the magnetoresistance effect element 10. That is, a low-resistance magnetoresistance effect element can be obtained.

Here, in $MgAl_2O_4$ described in Japanese Patent No. 5586028 and Japanese Unexamined Patent Application, First Publication No. 2013-175615, Mg and Al are introduced into sites A and B of a spinel structure, and substitution with ions having a different valence is not performed.

Therefore, the effect of reducing a resistance-area (RA) product cannot be sufficiently obtained.

In a case where ions having a different valence are introduced into the site of the divalent ions, the electronic state (band structure) of the tunnel barrier layer 3 changes. Specifically, by introducing ions having a different valence into the site where the divalent ions are originally present, impurity levels are formed in the band structure. Once impurity levels are formed, the height of barriers (barrier height) in the electronic state between the first and second ferromagnetic metal layer 1 and 2 and the tunnel barrier layer 3 is reduced. As a result, electrons are more likely to be transported between the first and second ferromagnetic metal layer 1 and 2 and the tunnel barrier layer 3, and the resistance of the magnetoresistance effect element 10 is reduced.

At this time, since the barrier height decreases, the maximum value of MR ratio also decreases. However, a decrease in MR ratio is merely small, and a magnetoresistance effect element having a high MR ratio and a low resistance can be obtained. Such a low-resistance magnetoresistance effect element 10 has been strongly demanded in order to realize high-frequency response, noise reduction, and the like in a narrow region such as a small-sized magnetic head.

The maximum value of MR ratio described herein refers to a maximum value of MR ratio which can be obtained during a normal operation of a magnetoresistance effect element, and does not mean that a high MR ratio can be maintained when a high bias voltage is applied.

In the compositional formula $A_{1-x}A'_xO$ of the tunnel barrier layer 3, A represents a divalent cation, and A' represents a trivalent cation.

A represents preferably a non-magnetic divalent cation, more preferably at least one selected from the group consisting of beryllium, magnesium, and zinc, and still more preferably magnesium.

Even in a case where divalent ions consist of only beryllium ions and zinc ions, metastable crystal structures are the same. Therefore, a tunnel barrier layer in which coherent tunneling occurs can be obtained. In addition, in a case where magnesium ions are provided as divalent ions, coherent tunneling can be stably obtained, and the MR ratio can be increased.

A' represents preferably a non-magnetic trivalent cation, and more preferably at least one selected from the group consisting of boron, aluminum, and gallium.

Specifically, for example, $Mg_{1-x}Al_xO$, $Be_{1-x}Al_xO$, $Zn_{1-x}Al_xO$, $(Mg, Zn)_{1-x}Al_xO$, $(Mg,Be)_{1-x}Al_xO$, or compounds in which at least a portion of the aluminum site in the above-described compounds is substituted with boron and gallium can be used.

As the number of constituent elements increases, impurity levels are likely to be formed, and a reduction in resistance progresses. On the other hand, as the number of constituent elements increases, the barrier height decreases, and thus the MR ratio decreases. Materials can be selectively used depending on the intended use.

In the compositional formula $A_{1-x}A'_xO$ of the tunnel barrier layer 3, the number of A ions constituting a primitive lattice is more than the number of A' ions. That is, in the compositional formula $A_{1-x}A'_xO$, the substitution amount is $0<x<0.5$. In a case where the substitution amount is within the above-described range, the lattice constant can be appropriately adjusted without changing the crystal structure. As a result, crystal structure-matching properties between the first ferromagnetic metal layer 1 and the second ferromagnetic metal layer 2 described below can be improved, and the magnetoresistance effect element 10 can maintain a sufficient MR ratio even at a high bias voltage.

As A' to be substituted, the above-described examples can be used, and a preferable range of the substitution amount varies depending on the ionic radius of A' to be substituted.

For example, in a case where an element to be substituted is boron, the substitution amount is preferably $0.05<x≤0.2$ and more preferably $0.05<x<0.1$.

For example, in a case where an element to be substituted is aluminum, the substitution amount is preferably $0<x<0.5$, more preferably, $0.1<x<0.4$, and still more preferably $0.3<x<0.4$.

For example, in a case where an element to be substituted is gallium, the substitution amount is preferably $0<x<0.5$, more preferably $0.1<x<0.4$, and still more preferably $0.25<x<0.35$.

In a case where the substitution amount of each of elements to be substituted is within the above-described range, the magnetoresistance effect element 10 having a low resistance can be obtained without a significant decrease in MR ratio. In addition, a crystal structure-matching property between the first ferromagnetic metal layer 1 and the second ferromagnetic metal layer 2 described below can be further improved, and the magnetoresistance effect element 10 can maintain a more sufficient MR ratio even at a high bias voltage.

(First Ferromagnetic Metal Layer and Second Ferromagnetic Metal Layer)

The first ferromagnetic metal layer 1 has a higher coercive force than the second ferromagnetic metal layer 2. That is, the magnetoresistance effect element 10 can function by fixing the magnetization of the first ferromagnetic metal layer 1 to one direction and relatively changing the magnetization direction of the second ferromagnetic metal layer 2. The first ferromagnetic metal layer 1 is called a pinned layer or a reference layer, and the second ferromagnetic metal layer 2 is called a free layer or a recording layer.

As a material of the first ferromagnetic metal layer 1, a well-known material capable of forming coherent tunneling can be used. For example, a metal selected from the group consisting of Cr, Mn, Co, Fe, and Ni, or a ferromagnetic alloy including one or more of the above-described metals can be used. In addition, an alloy including the above-described metals and at least one element of B, C, or N can also be used. Specific examples of the alloy include Co—Fe and Co—Fe—B.

In addition, in order to obtain a higher power, it is preferable that a Heusler alloy such as $Co_2FeSi$ be used. The Heusler alloy includes an intermetallic compound having a chemical composition of $X_2YZ$, in which X represents a Co-, Fe-, Ni-, or Cu-group transition metal element or noble metal element in the periodic table, Y represents a Mn-, V-, Cr-, or Ti-group transition metal element and can also represent an element represented by X, and Z represents a typical element in Groups III to V of the periodic table. Examples of the Heusler alloy include $Co_2FeSi$, $Co_2MnSi$, and $Co_2Mn_{1-a}Fe_aAl_bSi_{1-b}$.

In addition, in order to control the coercive force of the first ferromagnetic metal layer 1 to be higher than that of the second ferromagnetic metal layer 2, an antiferromagnetic material such as IrMn or PtMn may be used as a material in contact with the first ferromagnetic metal layer 1. Further, in order to prevent a leakage magnetic field of the first ferromagnetic metal layer 1 from affecting the second ferromagnetic metal layer 2, the first ferromagnetic metal layer 1 may have a synthetic ferromagnetic coupling structure.

Further, in a case where the magnetization direction of the first ferromagnetic metal layer 1 is perpendicular to a laminating surface, it is preferable that a laminated film of Co and Pt be used. Specifically, the first ferromagnetic metal layer 1 can have a configuration of [Co (0.24 nm)/Pt (0.16 nm)]$_6$/Ru (0.9 nm)/[Pt (0.16 nm)/Co (0.16 nm)]$_4$/Ta (0.2 nm)/FeB (1.0 nm).

As a material of the second ferromagnetic metal layer 2, a ferromagnetic material, in particular, a soft magnetic material can be used. For example, a metal selected from the group consisting of Cr, Mn, Co, Fe, and Ni, an alloy including one or more of the above-described metals, or an alloy including the above-described metals and at least one element of B, C, or N can be used. Specific examples of the alloy include Co—Fe, Co—Fe—B, and Ni—Fe.

Further, in a case where the magnetization direction of the second ferromagnetic metal layer 2 is perpendicular to a laminating surface, it is preferable that the thickness of the second ferromagnetic metal layer 2 be 2.5 nm or less. At an interface between the second ferromagnetic metal layer 2 and the tunnel barrier layer, perpendicular magnetic anisotropy can be imparted to the second ferromagnetic metal layer 2. In addition, the effect of perpendicular magnetic anisotropy may be attenuated by increasing the thickness of the second ferromagnetic metal layer 2, and it is preferable that the thickness of the second ferromagnetic metal layer 2 be as thin as possible.

In order to utilize the magnetoresistance effect element as a magnetic sensor, it is preferable that the resistance linearly change depending on an external magnetic field. In a laminated film of a general ferromagnetic layer, a magnetization direction is likely to face the inside of a laminating surface due to shape anisotropy. In this case, for example, a magnetic field is applied from the outside such that the magnetization direction of the first ferromagnetic metal layer is perpendicular to that of the second ferromagnetic metal layer. As a result, the resistance linearly changes depending on the external magnetic field. In this case, however, a mechanism for applying a magnetic field in the vicinity of the magnetoresistance effect element is necessary, which is not preferable from the viewpoint of integration. Therefore, it is preferable that the ferromagnetic metal layers themselves have magnetic anisotropy.

(Substrate and Undercoat Layer)

It is preferable that the substrate 4 have excellent flatness. In order to obtain a surface having excellent flatness, as a material of the substrate 4, for example, Si or AlTiC can be used. For example, in the case of a MRAM, a circuit formed of a Si substrate is necessary. Therefore, in a case where the magnetoresistance effect element 10 is used as a MRAM, it is preferable that a Si substrate be used. In addition, in a case where the magnetoresistance effect element is used as a magnetic head, it is preferable that an AlTiC substrate which is easily processed be used.

The undercoat layer 5 may be formed on a surface of the substrate 1 on the first ferromagnetic metal layer 1 side. In a case where the undercoat layer 5 is provided, the crystallinity such as crystal orientation or crystal grain size of each of the layers including the first ferromagnetic metal layer 1 laminated on the substrate 4 can be controlled.

The undercoat layer 5 may be conductive or insulating. In a case where it is desired to apply a current to the undercoat layer 5, it is preferable that the undercoat layer 5 be formed of a conductive material.

In one example, as the undercoat layer 5, a nitride layer which has a NaCl structure oriented to (001) and includes at least one element selected from the group consisting of Ti, Zr, Nb, V, Hf, Ta, Mo, W, B, Al, and Ce can be used.

In another example, as the undercoat layer 5, a perovskite conductive oxide layer represented by a compositional formula ABO$_3$ and oriented to (002) can be used. Here, the site A includes at least one element selected from the group consisting of Sr, Ce, Dy, La, K, Ca, Na, Pb, and Ba, and the site B includes at least one element selected from the group consisting of Ti, V, Cr, Mn, Fe, Co, Ni, Ga, Nb, Mo, Ru, Ir, Ta, Ce, and Pb.

In still another example, as the undercoat layer 5, an oxide layer which has a NaCl structure oriented to (001) and includes at least one element selected from the group consisting of Mg, Al, and Ce can be used.

In still another example, as the undercoat layer 5, a layer which has a tetragonal structure or a cubic structure oriented to (001) and includes at least one element selected from the group consisting of Al, Cr, Fe, Co, Rh, Pd, Ag, Ir, Pt, Au, Mo, and W can be used.

In addition, the undercoat layer 5 is not limited to a single-layer structure and may be a laminate structure in which the plural layers of the above-described examples are laminated. By devising the configuration of the undercoat layer 5, the crystallinity of each of the layers of the magnetoresistance effect element 10 is improved, and magnetic properties can be improved.

(Cap Layer)

In addition, it is preferable that the cap layer 6 be formed on a surface of the second ferromagnetic metal layer 2 opposite to the tunnel barrier layer 3. The cap layer 6 can control diffusion of elements from the second ferromagnetic metal layer 2. In addition, the cap layer 6 also contributes to the crystal orientation of each of the layers of the magnetoresistance effect element 10. As a result, by providing the cap layer 6, magnetic properties of the first and second ferromagnetic metal layer 1 and 2 in the magnetoresistance effect element 10 are stabilized, and the resistance of the magnetoresistance effect element 10 can be reduced.

As a material of the cap layer 6, a highly conductive material is preferably used. For example, Ru, Ta, Cu, Ag, or Au can be used. As the crystal structure of the cap layer 6, a fcc structure, a hcp structure, or a bcc structure can be appropriately set depending on the crystal structure of the ferromagnetic metal layer adjacent to the cap layer 6. The thickness of the cap layer 6 is not particularly limited as long as it is in a range where a distortion reduction effect is obtained and a decrease in MR ratio caused by shunting does not occur. The thickness of the cap layer 6 is preferably 1 nm to 30 nm.

(Configuration During Use)

Figure 2:
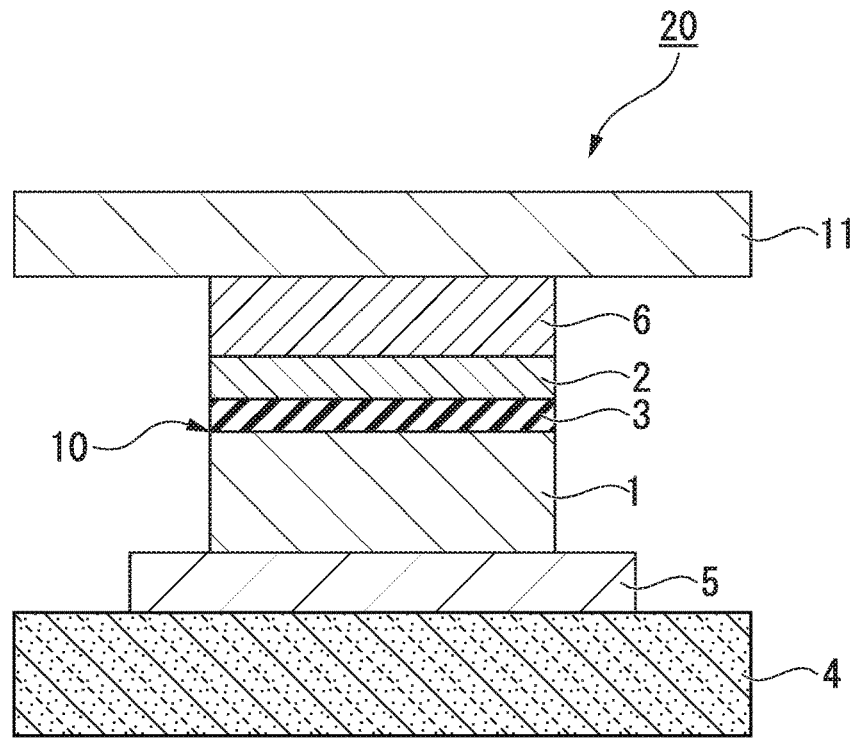
FIG. 2 is a schematic side view showing a magnetoresistance effect device including the magnetoresistance effect element according to the embodiment of the present invention.
Figure 3:
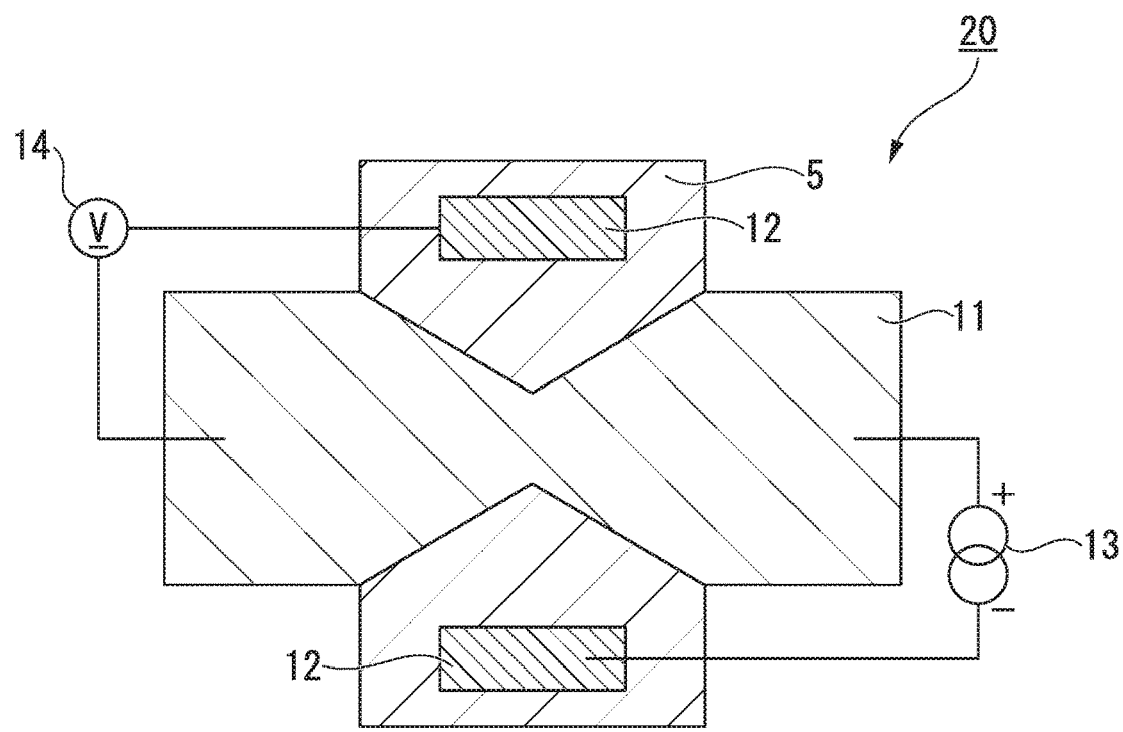
FIG. 3 is a schematic plan view showing the magnetoresistance effect device when seen from a laminating direction.

FIG. 2 is a schematic side view showing a magnetoresistance effect device including the magnetoresistance effect element according to the embodiment of the present invention. In addition, FIG. 3 is a schematic plan view showing the magnetoresistance effect device when seen from a laminating direction. In a magnetoresistance effect device 20, an electrode layer 11 is formed on a surface of the cap layer 6 opposite to the second ferromagnetic metal layer 2 in the magnetoresistance effect element 10 shown in FIG. 1. In addition, a power supply 13 and a voltmeter 14 are provided between the electrode layer 11 and an electrode layer 12 provided on the undercoat layer 5. By the power supply 13 applying a voltage to the electrode layer 11 and the undercoat layer 5, a current flows in a laminating direction of a laminate including the first ferromagnetic metal layer 1, the tunnel barrier layer 3, and the second ferromagnetic metal layer 2. At this time, the applied voltage can be monitored using the voltmeter 14.

In the magnetoresistance effect device 20 according to the embodiment of the present invention, crystal lattice mismatch of the first ferromagnetic metal layer 1, the tunnel barrier layer 3, and the second ferromagnetic metal layer 2 can be reduced. Therefore, spins can be prevented from being scattered while propagating from the first ferromagnetic metal layer 1 to the second ferromagnetic metal layer 2 through coherent tunneling of the tunnel barrier layer 3. That is, the MR ratio can be improved and a reduction in $V_{half}$ can be prevented.

(Shape and Dimension of Element)

The laminate shown in FIG. 2 including the first ferromagnetic metal layer 1, the tunnel barrier layer 3, and the second ferromagnetic metal layer 2 has a columnar shape. The laminate may have various shapes such as a circular shape, a quadrangular shape, a triangular shape, or a polygonal shape when seen in plain view, and preferably has a circular shape from the viewpoint of symmetry. That is, it is preferable that the laminate have a columnar shape.

In a case where the laminate has a columnar shape, the diameter of the laminate in plain view is preferably 80 nm or less, more preferably 60 nm or less, and still more preferably 30 nm or less.

In a case where the diameter is 80 nm or less, a domain structure is not likely to be formed in the ferromagnetic metal layers, and it is not necessary to consider a component having a different spin polarization in the ferromagnetic metal layers. Further, in a case where the diameter is 30 nm or less, a single domain structure is formed in the ferromagnetic metal layers, and a magnetization reversal speed or probability is improved. In addition, in a small-sized magnetoresistance effect element, there is a strong demand for a reduction in resistance.

(Evaluation Method)

An evaluation method of the magnetoresistance effect element will be described using FIGS. 2 and 3 as an example. As described above, the power supply 13 and the voltmeter 14 are disposed as shown in FIG. 3 such that a fixed current or a fixed voltage is applied to the magnetoresistance effect element. By measuring the voltage or the current while sweeping an external magnetic field, a change in the resistance of the magnetoresistance effect element can be measured.

The MR ratio is represented by the following expression.

MR Ratio(%)=$(R_{AP}-R_P)/R_P \times 100$ $R_P$ represents a resistance in a case where the magnetization direction of the first ferromagnetic metal layer 1 is parallel to that of the second ferromagnetic metal layer 2, and $R_{AP}$ represents a resistance in a case where the magnetization direction of the first ferromagnetic metal layer 1 is antiparallel to that of the second ferromagnetic metal layer 2.

$V_{half}$ can be obtained by measuring an MR ratio during application of a low bias voltage of, for example, 1 mV and specifying a voltage at which an MR ratio measured while increasing a bias voltage is reduced to half of that measured during the application of the low bias voltage.

RA refers to a normalized resistance value per unit area which is obtained by dividing a resistance value by the area of a joint surface of each layer, the resistance value being obtained by dividing an applied bias voltage by a current flowing in the laminating direction of the magnetoresistance effect element. The applied bias voltage and the current value flowing in the laminating direction of the magnetoresistance effect element can be measured and obtained using a voltmeter and an ammeter.

In addition, electrical conduction properties, which are obtained based on the applied bias voltage and the current density of the current flowing in the laminating direction of the magnetoresistance effect element, are fitted to Simmons's formula based on WKB approximation using a least square method. As a result, the height of a tunnel barrier (barrier height) can be calculated.

(Others)

In the above-described example, the first ferromagnetic metal layer 1 having a high coercive force is provided on the substrate 4 side with respect to the tunnel barrier layer 3. However, the present invention is not limited to this configuration. In a case where the first ferromagnetic metal layer 1 having a high coercive force is provided on a side opposite to the substrate 4 with respect to the tunnel barrier layer 3, the coercive force decreases as compared to the case where the first ferromagnetic metal layer 1 is provided on the substrate 4 side with respect to the tunnel barrier layer 3. However, the tunnel barrier layer 3 can be formed using the crystallinity of the substrate, and thus the MR ratio can be increased.

As described above, in the magnetoresistance effect element according to one embodiment of the present invention, crystal lattice-matching properties between the first and second ferromagnetic metal layer 1 and 2 and the tunnel barrier layer 3 can be improved, and a sufficient MR ratio can be maintained even at a high bias voltage. In addition, by substituting some of divalent ions with ions having a different valence, the resistance of the magnetoresistance effect element can be reduced. Therefore, the magnetoresistance effect element according to one embodiment of the present invention can be used as a magnetic sensor or a memory such as a MRAM. In particular, the magnetoresistance effect element according to one embodiment of the present invention is effective in a product which is used at a bias voltage higher than that used in a magnetic sensor of the related art.

(Manufacturing Method)

The magnetoresistance effect element can be formed using, for example, a magnetron sputtering device. The tunnel barrier layer 3 is formed by forming an about 0.4 to 2.0 nm thickness metal thin film consisting Al and divalent cations of plural non-magnetic elements, on the first ferromagnetic metal layer 1 by sputtering, performing plasma oxidation or natural oxidation using oxygen introduction thereon, and performing a heat treatment thereon. As the film-forming method, not only a magnetron sputtering method but also a thin film-forming method such as a vapor deposition method, a laser ablation method, or a MBE method can be used.

Hereinabove, the preferable embodiment of the present invention has been described in detail. However, the present invention is not limited to the specific embodiment, and various modifications and changes can be made within the scope of the present invention described in Claims.

EXAMPLES

Example 1

Each of layers of a magnetoresistance effect element was formed on a substrate, on which a thermal silicon oxide film was formed, using a magnetron sputtering method.

First, as an undercoat layer, Ta (5 nm)/Ru (3 nm) was formed. Next, as a first ferromagnetic metal layer, IrMn (12 nm)/CoFe (10 nm)/Ru (0.8 nm)/CoFe (7 nm) were laminated in this order on the undercoat layer.

Next, a tunnel barrier layer was formed on the obtained first ferromagnetic metal layer in the following procedure.

First, using a target of Mg and a target of an alloy composition of $Mg_{0.985}Al_{0.015}$, Mg (0.15 nm)/$Mg_{0.985}Al_{0.015}$ (0.5 nm)/Mg (0.15 nm) were laminated in this order. A sample on which the above-described laminate was formed was put into an oxidation chamber of an ultrahigh vacuum of $1.0 \times 10^{-8}$ Pa or lower, and Ar and oxygen were introduced into the oxidation chamber. As a result, an oxidation treatment was performed. The oxidation treatment was performed by natural oxidation. Regarding conditions of the natural oxidation, the natural oxidation time was 10 seconds, a partial pressure ratio of Ar to oxygen was 1:10, and a total gas pressure was 0.05 Pa. An alloy target can be used to form an alloy film and thereafter the oxidation treatment can be performed on the alloy film in order to obtain an oxide film of a tunnel barrier layer with the desired composition. Also, a target including oxygen, e.g., a target of composition $Mg_{0.985}Al_{0.015}O_x$ ($0<x<1.0075$) instead of a target of an alloy composition of $Mg_{0.985}Al_{0.015}$, can be used to form an oxide film of a tunnel barrier layer. In this case, Mg (0.15 nm)/$Mg_{0.985}Al_{0.015}O_x$ (0.5 nm)/Mg (0.15 nm) are laminated, and the oxidation treatment is performed thereon.

The sample was put into the film-forming chamber again, and Mg (0.15 nm)/$Mg_{0.985}Al_{0.015}$ (0.5 nm)/Mg (0.15 nm) were laminated again in this order on the sample having undergone the oxidation treatment. An oxidation treatment was performed on the sample having undergone the relamination in the oxidation chamber of an ultrahigh vacuum of $1.0 \times 10^{-8}$ Pa or lower. The oxidation treatment was performed by natural oxidation and inductively coupled plasma oxidation. The natural oxidation time was 30 seconds, the inductively coupled plasma oxidation time was 5 seconds, a partial pressure ratio of Ar to oxygen was 1:20, and a total gas pressure was 0.08 Pa.

The sample on which the predetermined tunnel barrier layer was formed as described above was put into the film-forming chamber again, CoFe (5 nm) was formed as a second ferromagnetic metal layer, and Ru (3 nm)/Ta (5 nm) was formed as a cap layer.

The sample on which the respective layers were laminated was put into an annealing device was heated in an Ar atmosphere and an environment of 450 degrees for 10 minutes. Thereafter, under an applied field of 8 kOe, a heat treatment was performed at 280 degrees for 6 hours. As a result, a magnetoresistance effect element was prepared.

(Structure Analysis)

A structure of the tunnel barrier layer in the magnetoresistance effect element prepared in Example 1 was measured by electron beam diffraction and X-ray diffraction. Since the ferromagnetic metal layers were formed below and above the tunnel barrier layer in the magnetoresistance effect element, the structure of the tunnel barrier layer was not able to be analyzed. Therefore, the measurement was performed before laminating the second ferromagnetic metal layer on the tunnel barrier layer. In order to remove the influence of the layer which was provided below the tunnel barrier layer, the measurement was secured by repeating a film-forming step and an oxidation step 10 times such that, Mg (0.15 nm)/$Mg_{0.985}Al_{0.015}$ (0.5 nm)/Mg (0.15 nm) was formed in this order by sputtering.

Based on the results of the X-ray diffraction, main peaks were able to be indexed as peaks derived from symmetry of the space group Pm3m as the crystal structure of MgO, and it was verified that the tunnel barrier layer had the same structure as MgO. In addition, in the electron beam diffraction measurement, weak peaks other than the peaks which were indexed as the structure of MgO were recognized. The structure analysis was performed again in consideration of the intensities of the newly obtained peaks. As a result, it was found that the crystal structure of the tunnel barrier layer had a space group of I-43m or Pm-3m distorted from a NaCl structure. In addition, the lattice constant was 0.4202 nm (4.202 Angstrom) when estimated from the space symmetry of the crystal structure of MgO which was assumed based on the results of the X-ray diffraction measurement.

(Composition Analysis)

Using an atom probe method, a composition ratio of the tunnel barrier layer was determined. Here, the atom probe method was used. However, not only the atom probe method but also energy dispersive X-ray spectroscopy (EDS) and electron energy loss spectroscopy (EELS) may be used. As a result of the analysis, it was found that Mg:Al=0.96:0.04.

Figure 4:
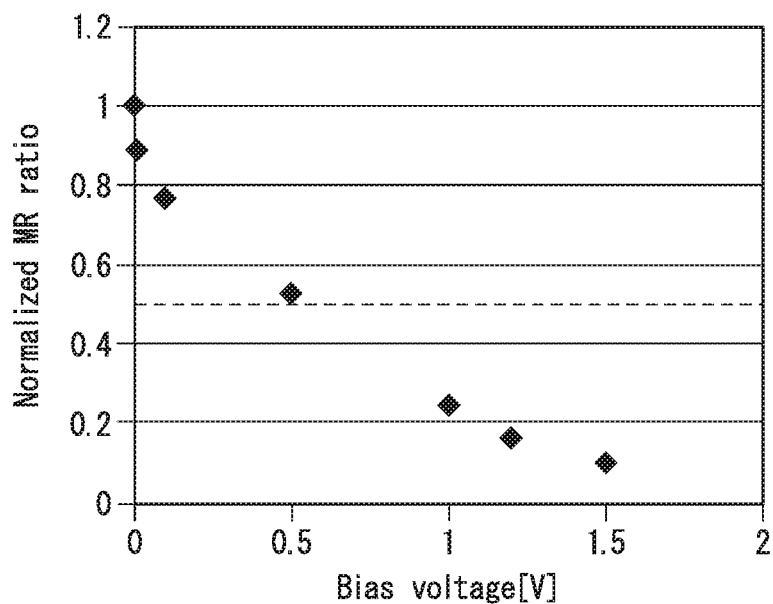
FIG. 4 is a graph showing the results of measuring an MR ratio while increasing a bias voltage applied to a magnetoresistance effect element according to Example 1.

FIG. 4 is a graph showing the measurement results when an MR ratio measured while increasing a bias voltage applied to a magnetoresistance effect element according to Example 1 was normalized by an MR ratio measured during application of a bias voltage of 0.001 V. In a case where a bias voltage of 0.001 V was applied, an MR ratio was 214%. In a case where a bias voltage of 1 V was applied, an MR ratio was 51.5%. As shown in FIG. 4, $V_{half}$ was 0.55 V when normalized by an MR ratio measured during application of a bias voltage of 0.001 V, which was set as 1. At this time, the diameter of the magnetoresistance effect element was 0.1 μm.

Example 2

Example 2 was different from Example 1 only in that: targets used for preparing the tunnel barrier layer were changed; and the composition of the tunnel barrier layer was changed.

In Example 2, as the targets for preparing the tunnel barrier layer, a target of $Mg_{0.8}Zn_{0.2}$ and a target of an alloy composition of $Mg_{0.4}Zn_{0.1}Al_{0.5}$ were used. In addition, by performing the film-forming step once, $Mg_{0.8}Zn_{0.2}$ (0.15 nm)/$Mg_{0.4}Zn_{0.1}Al_{0.5}$ (0.5 nm)/$Mg_{0.8}Zn_{0.2}$ (0.15 nm) were formed by sputtering. Natural oxidation was performed by setting a partial pressure ratio of Ar to oxygen as 1:25. A target including oxygen, e.g., a target of composition $Mg_{0.4}Zn_{0.1}Al_{0.5}O_x$ ($0<x<1.25$) instead of a target of an alloy composition of $Mg_{0.4}Zn_{0.1}Al_{0.5}$, can be used to form an oxide film of a tunnel barrier layer.

Thereafter, the film-forming step was performed again, and then natural oxidation and inductively coupled plasma oxidation were performed. Conditions of the natural oxidation (except for a partial pressure ratio of Ar to oxygen) in the first process and conditions of the film-forming step and the oxidation step in the second process were the same as in Example 1.

(Structure Analysis)

A structure of the tunnel barrier layer in the magnetoresistance effect element prepared in Example 2 was measured by electron beam diffraction and X-ray diffraction. In Example 2, as in Example 1, the measurement was performed after a sufficient thickness was secured by repeating the film-forming step and the oxidation step ten times.

Based on the results of the X-ray diffraction, main peaks were able to be indexed as peaks derived from symmetry of the space group Pm3m as the crystal structure of MgO, and it was verified that the tunnel barrier layer had the same structure as MgO. In addition, in the electron beam diffraction measurement, weak peaks other than the peaks which were indexed as the structure of MgO were recognized. The structure analysis was performed again in consideration of the intensities of the newly obtained peaks. As a result, it was found that the crystal structure of the tunnel barrier layer had a space group of I-43m or Pm-3m distorted from a NaCl structure. In addition, the lattice constant was 0.4213 nm (4.213 Angstrom) when estimated from the space symmetry of the crystal structure of MgO, which was assumed based on the results of the X-ray diffraction measurement.

(Composition Analysis)

As a result of performing the analysis using the same method as in Example 1, it was found that Mg:Zn:Al=0.4: 0.1:0.45.

Figure 5:
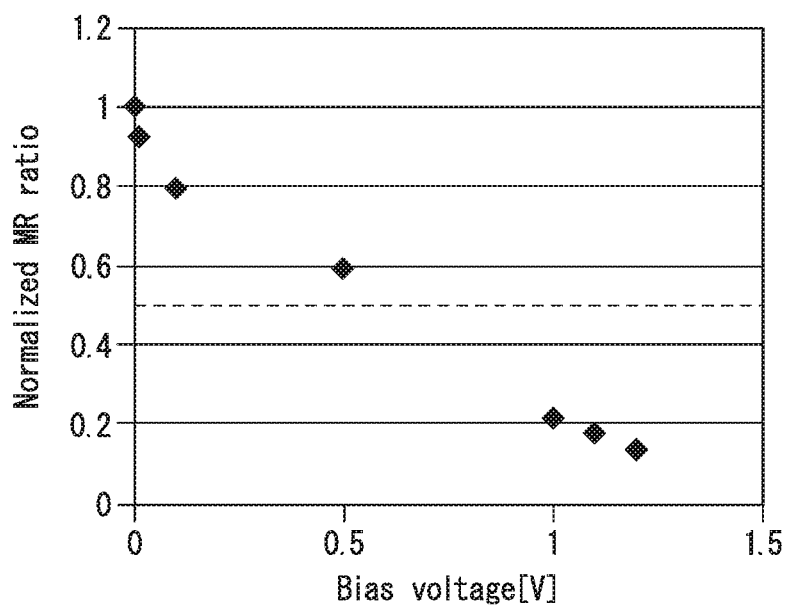
FIG. 5 is a graph showing the results of measuring an MR ratio while increasing a bias voltage applied to a magnetoresistance effect element according to Example 2.

FIG. 5 is a graph showing the measurement results when an MR ratio measured while increasing a bias voltage applied to a magnetoresistance effect element according to Example 2 was normalized by an MR ratio measured during application of a bias voltage of 0.001 V. In a case where a bias voltage of 0.001 V was applied, an MR ratio was 205%. In a case where a bias voltage of 1 V was applied, an MR ratio was 44.1%. As shown in FIG. 5, $V_{half}$ was 0.5 V when normalized by an MR ratio measured during application of a bias voltage of 0.001 V, which was set as 1. At this time, the diameter of the magnetoresistance effect element was 0.1 μm.

Example 3

In Example 3, the targets for preparing the tunnel barrier layer were changed, the ratio between Mg and Al in the composition ratio was changed, and then a change in lattice constant and a change in $V_{half}$ were measured. Preparation conditions other than the change of the targets were the same as in Example 1.

Figure 6:
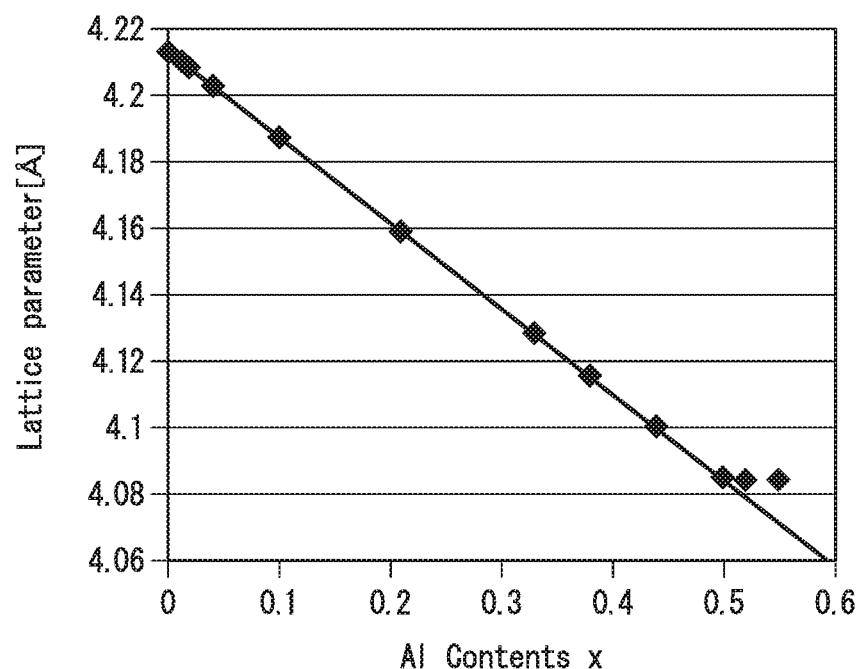
FIG. 6 is a diagram showing a change in lattice constant when a ratio between Mg and Al was changed in a composition ratio of a tunnel barrier layer.
Figure 7:
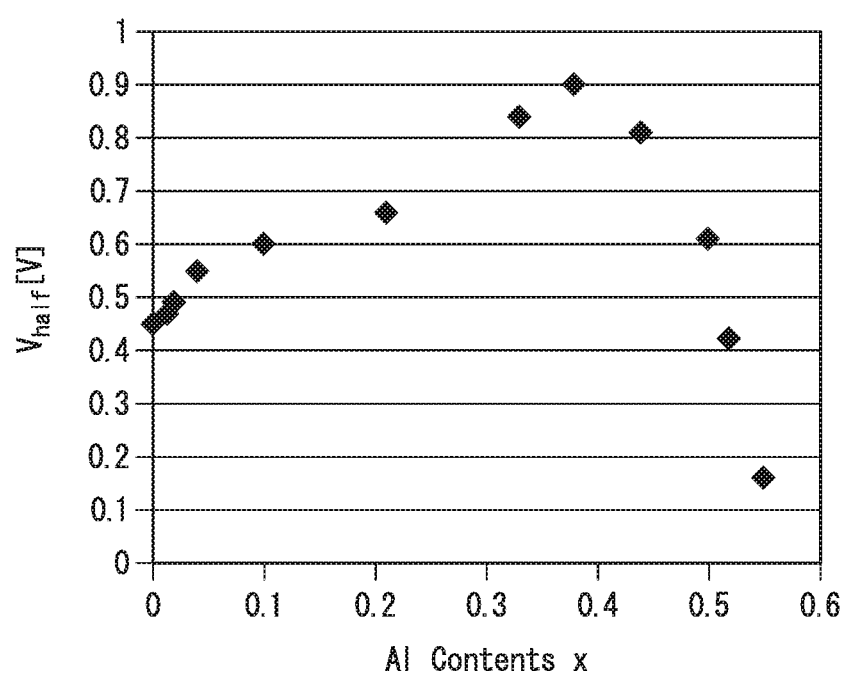
FIG. 7 is a diagram showing a change in $V_{half}$ when a ratio between Mg and Al was changed in a composition ratio of a tunnel barrier layer.

FIG. 6 is a diagram showing a change in lattice constant when the ratio between Mg and Al was changed in the composition ratio of the tunnel barrier layer. In addition, FIG. 7 is a diagram showing a change in $V_{half}$ when the ratio between Mg and Al was changed in the composition ratio of the tunnel barrier layer. The compositional formula of the tunnel barrier layer in the magnetoresistance effect element according to Example 3 was represented by $Mg_{1-x}Al_xO$ in which 0<x<0.6.

As shown in FIG. 6, as the substitution amount x of Al was increased, the lattice constant was linearly decreased. On the other hand, in the vicinity of an x range of higher than 0.5, a change in lattice constant was not shown. This shows that the substitution amount of Al in the MgO-based structure was about 0.5. In addition, $V_{half}$ was rapidly decreased in the vicinity of x=0.5, and it was found that, in a case where the substitution amount x of Al was 0.5 or higher, Al functioned as a spin scatterer.

Example 4

In Example 4, the targets for preparing the tunnel barrier layer were changed, and a composition of a tunnel barrier layer to be formed was represented by $Mg_{1-x}Ga_xO$ in which 0<x<0.6.

At this time, a ratio between Mg and Ga in the composition ratio was changed, and then a change in lattice constant and a change in $V_{half}$ were measured. Preparation conditions other than the change of the targets were the same as in Example 1.

Figure 8:
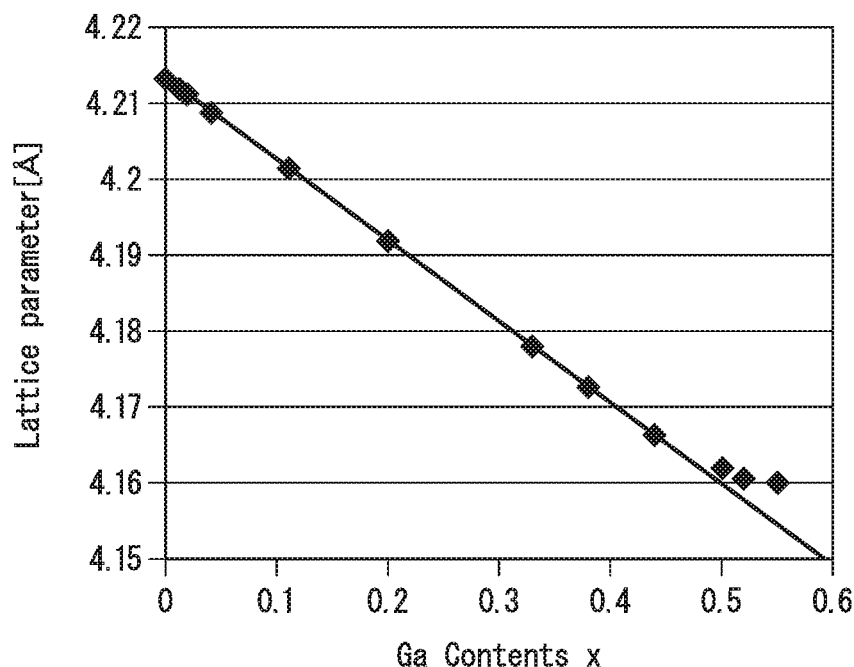
FIG. 8 is a diagram showing a change in lattice constant when a ratio between Mg and Ga was changed in a composition ratio of a tunnel barrier layer.
Figure 9:
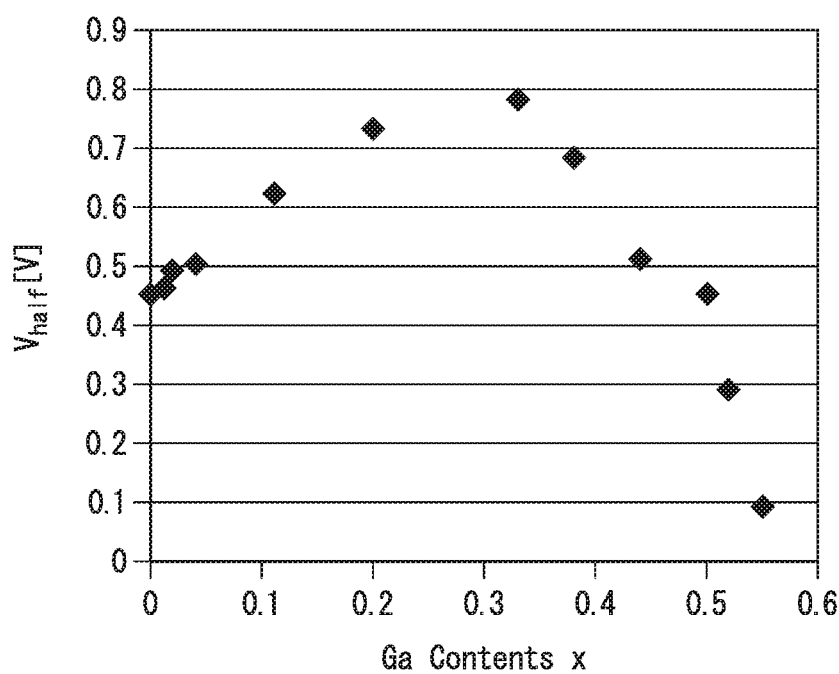
FIG. 9 is a diagram showing a change in $V_{half}$ when a ratio between Mg and Ga was changed in a composition ratio of a tunnel barrier layer.

FIG. 8 is a diagram showing a change in lattice constant when the ratio between Mg and Ga was changed in the composition ratio of the tunnel barrier layer. In addition, FIG. 9 is a diagram showing a change in $V_{half}$ when the ratio between Mg and Ga was changed in the composition ratio of the tunnel barrier layer.

As shown in FIG. 8, as the substitution amount x of Ga was increased, the lattice constant was linearly decreased. On the other hand, in the vicinity of an x range of higher than 0.5, a change in lattice constant was not shown. This shows that the substitution amount of Ga in the MgO-based structure was about 0.5. In addition, $V_{half}$ was rapidly decreased in the vicinity of x=0.5, and it was found that, in a case where the substitution amount x of Ga was 0.5 or higher, Ga functioned as a spin scatterer.

Example 5

In Example 5, the targets for preparing the tunnel barrier layer were changed, and a composition of a tunnel barrier layer to be formed was represented by $Mg_{1-x}B_xO$ in which 0<x<0.6. At this time, a ratio between Mg and B in the composition ratio was changed, and then a change in lattice constant and a change in $V_{half}$ were measured. Preparation conditions other than the change of the targets were the same as in Example 1.

Figure 10:
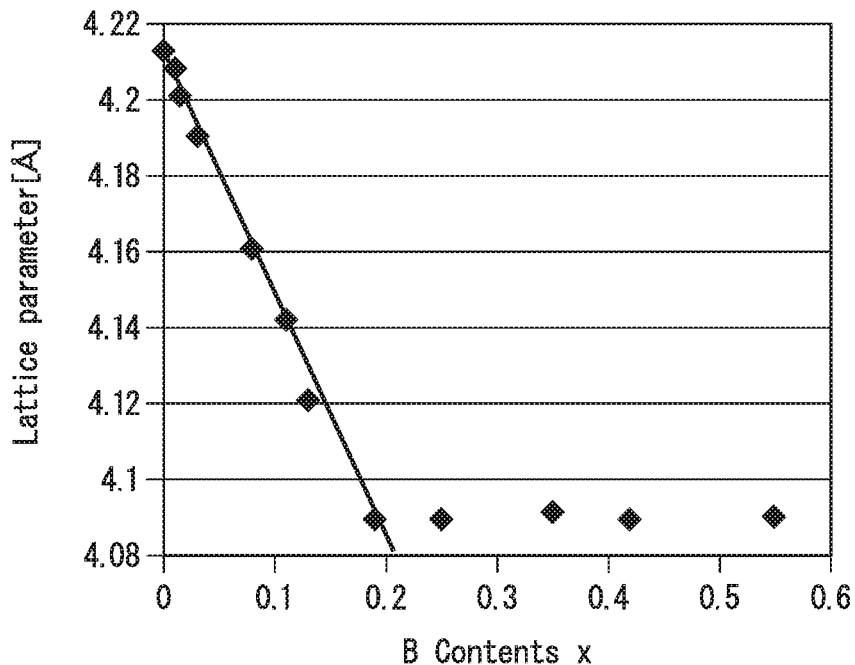
FIG. 10 is a diagram showing a change in lattice constant when a ratio between Mg and B was changed in a composition ratio of a tunnel barrier layer.
Figure 11:
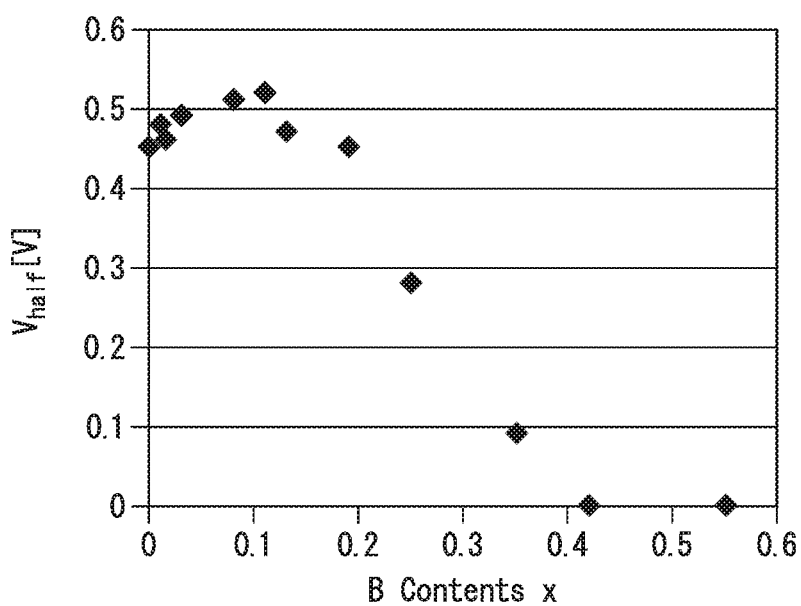
FIG. 11 is a diagram showing a change in $V_{half}$ when a ratio between Mg and B was changed in a composition ratio of a tunnel barrier layer.

FIG. 10 is a diagram showing a change in lattice constant when the ratio between Mg and B was changed in the composition ratio of the tunnel barrier layer. In addition, FIG. 11 is a diagram showing a change in $V_{half}$ when the ratio between Mg and B was changed in the composition ratio of the tunnel barrier layer.

As shown in FIG. 10, as the substitution amount x of Ga was increased, the lattice constant was linearly decreased. On the other hand, in the vicinity of an x range of higher than 0.2, a change in lattice constant was not shown. This shows that the substitution amount of B in the MgO-based structure was about 0.2. In addition, $V_{half}$ was rapidly decreased in the vicinity of x=0.2, and it was found that, in a case where the substitution amount x of B was 0.2 or higher, B functioned as a spin scatterer.

Comparative Example 1

Comparative Example 1 was different from Example 1 in that the tunnel barrier layer was formed of MgO. That is, in a film-forming step of Example 1, only a MgO layer (0.8 nm) was prepared by performing a sputtering step once using a target made of MgO only. The other conditions were the same as in Example 1.

(Structure Analysis)

A structure of the tunnel barrier layer in the magnetoresistance effect element prepared in Comparative Example 1 was measured by electron beam diffraction and X-ray diffraction. In Comparative Example 1, as in Example 1, the measurement was performed after a sufficient thickness was secured by repeating the sputtering step and the oxidation step ten times.

Based on the results of the X-ray diffraction, main peaks were able to be indexed as peaks derived from symmetry of the space group Pm3m as the crystal structure of MgO, and it was verified that the tunnel barrier layer had the same structure as MgO. In addition, in the electron beam diffraction measurement, peaks other than the peaks which were indexed as the structure of MgO were not recognized. It was found from the above result that the tunnel barrier layer was formed of MgO.

Figure 12:
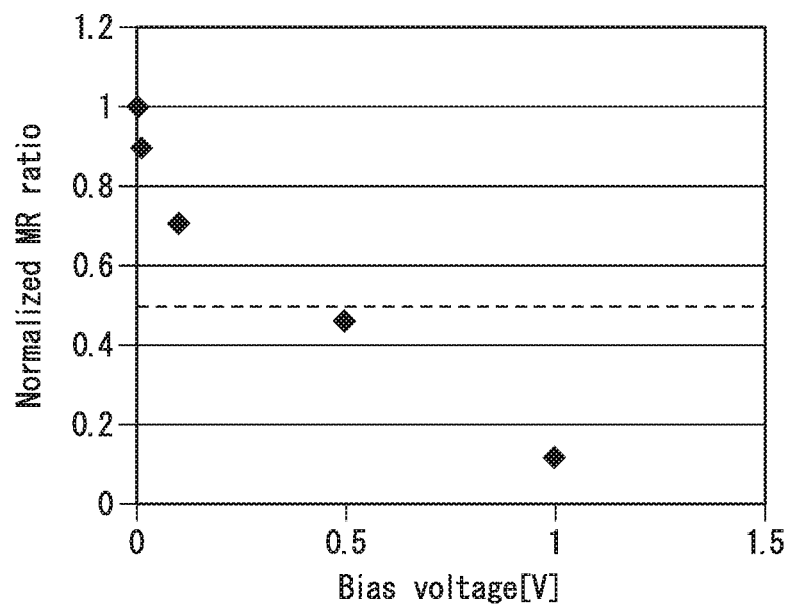
FIG. 12 is a graph showing the measurement results when an MR ratio measured while increasing a bias voltage applied to a magnetoresistance effect element according to Comparative Example 1 was normalized by an MR ratio measured during application of a bias voltage of 0.001 V.

FIG. 12 is a graph showing the measurement results when an MR ratio measured while increasing a bias voltage applied to the magnetoresistance effect element according to Comparative Example 1 was normalized by an MR ratio measured during application of a bias voltage of 0.001 V. In a case where a bias voltage of 0.001 V was applied, an MR ratio was 230%. In a case where a bias voltage of 1 V was applied, an MR ratio was 27.1%. As shown in FIG. 12, $V_{half}$ was 0.45 V when normalized by an MR ratio measured during application of a bias voltage of 0.001 V, which was set as 1.

Comparative Example 2

Comparative Example 2 was different from Comparative Example 1 in that the tunnel barrier layer was formed of $MgAl_2O_4$ having a spinel structure. The other conditions were the same as in Comparative Example 1. As a result of the structure analysis, it was found that the $MgAl_2O_4$ layer was formed.

Figure 13:
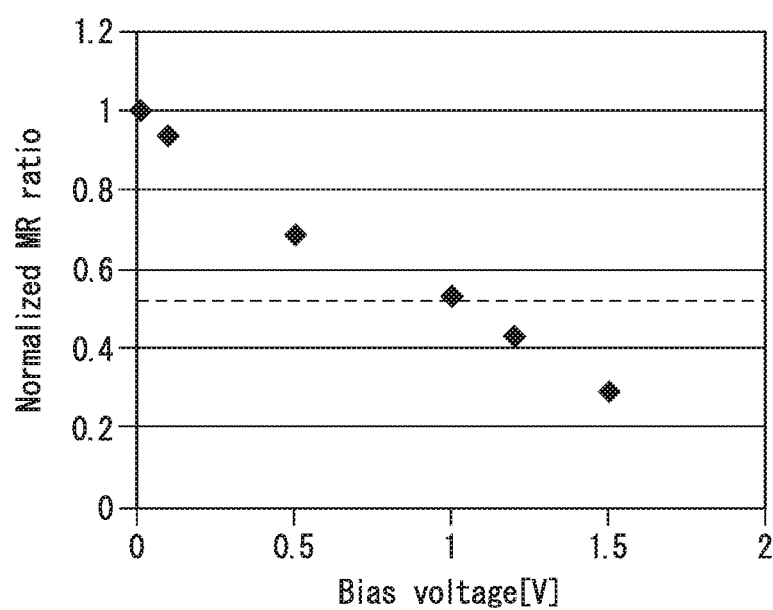
FIG. 13 is a graph showing the measurement results when an MR ratio measured while increasing a bias voltage applied to a magnetoresistance effect element according to Comparative Example 2 was normalized by an MR ratio measured during application of a bias voltage of 0.001 V.

FIG. 13 is a graph showing the measurement results when an MR ratio measured while increasing a bias voltage applied to the magnetoresistance effect element according to Comparative Example 2 was normalized by an MR ratio measured during application of a bias voltage of 0.001 V. In a case where a bias voltage of 0.001 V was applied, an MR ratio was 148%. In a case where a bias voltage of 1 V was applied, an MR ratio was 79%. As shown in FIG. 12, $V_{half}$ was 1.1 V when normalized by an MR ratio measured during application of a bias voltage of 0.001 V, which was set as 1.

Figure 14:
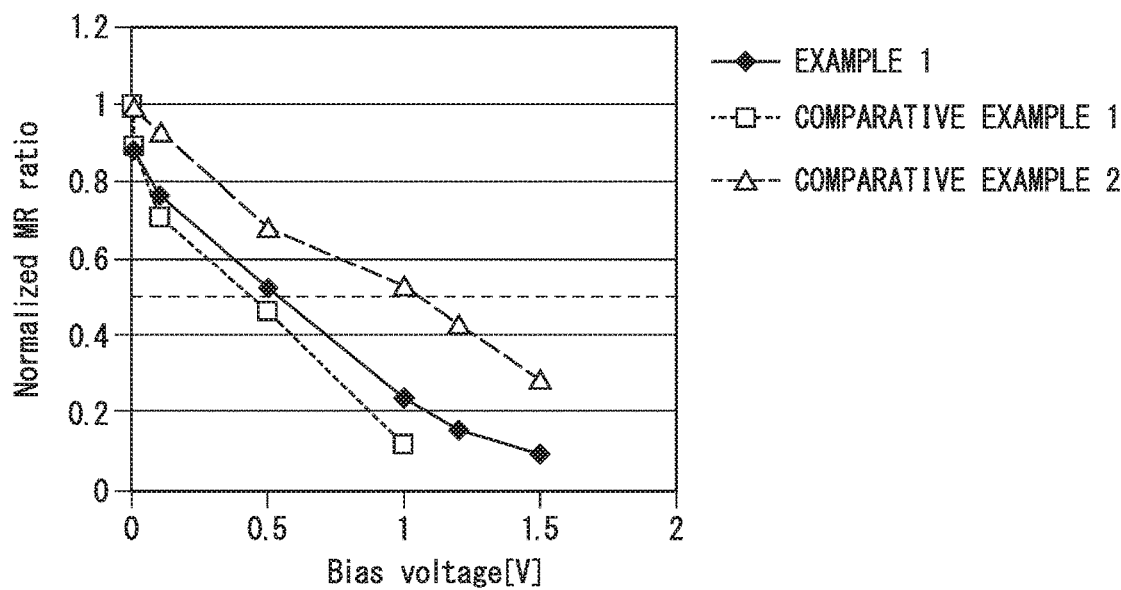
FIG. 14 is a graph showing the measurement results when MR ratios measured while increasing bias voltages applied to the magnetoresistance effect elements according to Example 1 and Comparative Examples 1 and 2 were normalized by an MR ratio measured during application of a bias voltage of 0.001 V.
Figure 15:
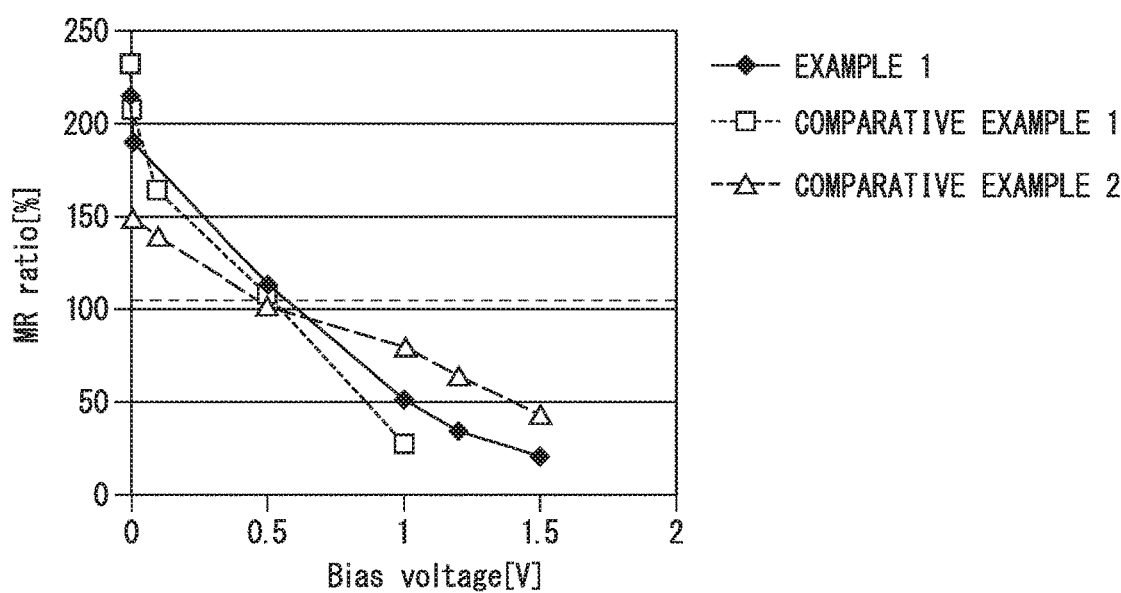
FIG. 15 is a graph showing the measurement results when MR ratios measured while increasing bias voltages applied to the magnetoresistance effect elements according to Example 1 and Comparative Examples 1 and 2 were normalized by an MR ratio measured during application of a bias voltage of 0.001 V.

FIGS. 14 and 15 are graphs showing the results of comparing Example 1 and Comparative Examples 1 and 2. FIG. 14 is a graph showing the results of comparing the measurement results when the MR ratios measured while increasing bias voltages applied to the magnetoresistance effect elements were normalized by an MR ratio measured during application of a bias voltage of 0.001 V. FIG. 15 is a graph showing the results of measuring MR ratios while increasing bias voltages applied to the magnetoresistance effect elements.

As shown in FIG. 14, the values of $V_{half}$ satisfies Comparative Example 2>Example 1>Comparative Example 1. In Comparative Example 2 in which the tunnel barrier layer was formed of MgAl2O4, the value of $V_{half}$ was the highest, and in Comparative Example 1 in which the tunnel barrier layer was formed of MgO, the value of $V_{half}$ was the lowest. On the other hand, regarding the MR ratios shown in FIG. 15, in a region of $V_{half}$ or lower, the MR ratios of Example 1 and Comparative Example 1 were higher than that of Comparative Example 2. That is, by adopting a MgO structure or a structure similar to a MgO structure as the tunnel barrier layer, a decrease in MR ratio in a region of $V_{half}$ or lower can be reduced as compared to a case where a spinel structure is adopted as the tunnel barrier layer. Therefore, in a case where the tunnel barrier layer is used at least in a region of $V_{half}$ or lower, a structure similar to MgO is more preferable than a spinel structure. In addition, by substituting some of divalent ions with trivalent ions in the structure similar to a MgO structure, $V_{half}$ can be increased to be higher than that of MgO.

In addition, in a case where Examples 1 to 5 in which the tunnel barrier layer had a structure similar to a MgO structure were compared to Comparative Example 1, it was found that, by substituting some of divalent ions with trivalent ions, the lattice constant was changed and lattice mismatch was reduced. In addition, as a result, the magnetoresistance effect elements were able to be obtained, in which a high value of $V_{half}$ was able to be obtained, and the MR ratio was not likely to decrease even at a high bias voltage.

While preferred embodiments of the invention have been described and illustrated above, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

EXPLANATION OF REFERENCES

10: MAGNETORESISTANCE EFFECT ELEMENT
1: FIRST FERROMAGNETIC METAL LAYER
2: SECOND FERROMAGNETIC METAL LAYER
3: TUNNEL BARRIER LAYER
4: SUBSTRATE
5: UNDERCOAT LAYER
6: CAP LAYER
20: MAGNETORESISTANCE EFFECT DEVICE
11, 12: ELECTRODE LAYER
13: POWER SUPPLY
14: VOLTMETER

What is claimed is:

1. A magnetoresistance effect element, comprising:
a first ferromagnetic metal layer;
a second ferromagnetic metal layer; and
a tunnel barrier layer that is provided between the first ferromagnetic metal layer and the second ferromagnetic metal layer,
wherein:
the tunnel barrier layer is formed of a non-magnetic oxide having a cubic crystal structure represented by a compositional formula $A_{1-x}A'_xO$, where A represents a divalent cation, A' represents a trivalent cation, and x satisfies 0<x<0.5,
the cubic crystal structure has a space group of I-43m or Pm-3m,
predetermined ions are substituted with ions having a different ionic radius from that of the predetermined ions in the cubic crystal structure; and
a number of A ions is more than a number of A' ions in a primitive lattice of the cubic crystal structure.

2. The magnetoresistance effect element according to claim 1, wherein A in the compositional formula represents at least one selected from a group consisting of beryllium, magnesium, and zinc.

3. The magnetoresistance effect element according to claim 1, wherein A' in the compositional formula represents at least one selected from a group consisting of boron, aluminum, and gallium.

4. The magnetoresistance effect element according to claim 1, wherein
A' in the compositional formula represents boron, and
x in the compositional formula satisfies 0.05<x≤0.2.

5. The magnetoresistance effect element according to claim 1, wherein
A' in the compositional formula represents aluminum, and
x in the compositional formula satisfies 0<x<0.5.

6. The magnetoresistance effect element according to claim 1, wherein

A' in the compositional formula represents gallium, and x in the compositional formula satisfies 0<x<0.5.

7. The magnetoresistance effect element according to claim 1, wherein the cubic crystal structure is a structure distorted from a NaCl crystal structure.

8. The magnetoresistance effect element according to claim 1, wherein:
the divalent cation represented by A and the trivalent cation represented by A' occupy sites in the cubic crystal structure that correspond to sites occupied by $Mg^{2+}$ in a crystal structure of MgO; and
the divalent cation represented by A is substituted with the trivalent cation represented by A' in the sites in the cubic crystal structure that correspond to the sites occupied by $Mg^{2+}$ in the crystal structure of MgO.

9. The magnetoresistance effect element according to claim 1, wherein the divalent cation represented by A is substituted with the trivalent cation represented by A' in sites in the cubic crystal structure.

10. A magnetoresistance effect element, comprising:
a first ferromagnetic metal layer;
a second ferromagnetic metal layer; and
a tunnel barrier layer that is provided between the first ferromagnetic metal layer and the second ferromagnetic metal layer,
wherein:
the tunnel barrier layer is formed of a non-magnetic oxide having a cubic crystal structure represented by a compositional formula $A_{1-x}A'_xO$, where A represents at least one divalent cation selected from the group consisting of beryllium, magnesium, and zinc, A' represents at least one trivalent cation selected from the group consisting of boron, aluminum, and gallium, and x satisfies 0<x<0.5,
the cubic crystal structure has a space group of I-43m or Pm-3m,
predetermined ions are substituted with ions having a different ionic radius from that of the predetermined ions in the cubic crystal structure; and
a number of A ions is more than a number of A' ions in a primitive lattice of the cubic crystal structure.

11. The magnetoresistance effect element according to claim 10, wherein the cubic crystal structure is a structure distorted from a NaCl crystal structure.

12. The magnetoresistance effect element according to claim 10, wherein:
the divalent cation represented by A and the trivalent cation represented by A' occupy sites in the cubic crystal structure that correspond to sites occupied by $Mg^{2+}$ in a crystal structure of MgO; and
the divalent cation represented by A is substituted with the trivalent cation represented by A' in the sites in the cubic crystal structure that correspond to the sites occupied by $Mg^{2+}$ in the crystal structure of MgO.

13. The magnetoresistance effect element according to claim 10, wherein the divalent cation represented by A is substituted with the trivalent cation represented by A' in sites in the cubic crystal structure.

* * * * *